(12) United States Patent
Hung et al.

(10) Patent No.: US 11,456,749 B2
(45) Date of Patent: Sep. 27, 2022

(54) TIMING MARGIN DETECTING CIRCUIT, TIMING MARGIN DETECTING METHOD AND CLOCK AND DATA RECOVERY SYSTEM

(71) Applicant: NOVATEK Microelectronics Corp., Hsin-Chu (TW)

(72) Inventors: Hao-Wei Hung, New Taipei (TW); Wei-Sheng Tseng, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/920,363

(22) Filed: Jul. 2, 2020

(65) Prior Publication Data
US 2022/0006460 A1 Jan. 6, 2022

(51) Int. Cl.
*H03L 7/08* (2006.01)
(52) U.S. Cl.
CPC .................. *H03L 7/0807* (2013.01)
(58) Field of Classification Search
CPC .......... H03K 2005/00084; H03K 5/14; H04B 17/364; H04L 1/20; H04L 1/203; H04L 5/006; H04L 7/033; H04L 7/04; H04L 7/0037; H04L 7/0041; G01R 31/3171; G01R 31/31725; H03L 7/091; H03L 7/0807
See application file for complete search history.

(56) References Cited

U.S. PATENT DOCUMENTS

| | | | | |
|---|---|---|---|---|
| 7,069,458 B1* | 6/2006 | Sardi | ..................... | H03L 7/0996 327/152 |
| 8,451,883 B1* | 5/2013 | Ding | .................. | G01R 31/3171 375/228 |
| 9,397,868 B1* | 7/2016 | Hossain | ................... | H04L 7/033 |
| 11,165,554 B1* | 11/2021 | Huss | ......................... | G06F 1/04 |
| 2004/0086034 A1* | 5/2004 | Jungerman | ............. | H04L 1/203 375/224 |

(Continued)

OTHER PUBLICATIONS

Hye-Yoon Joo and Deog-Kyoon Jeong, "A Maximum-Eye-Tracking CDR with Biased Data-Level and Eye Slope Detector for Optimal Timing Adaptation", Seoul National University, IEEE Asian Solid-State Circuits Conference, Nov. 2019 (Year: 2019).*

*Primary Examiner* — Aristocratis Fotakis
(74) *Attorney, Agent, or Firm* — Winston Hsu

(57) ABSTRACT

A timing margin detecting circuit is provided. The timing margin detecting circuit comprises a delay element, receiving a first data signal and a first clock signal, configured to generate a second data signal and a second clock signal, wherein the second clock signal has a delay relative to the second data signal; a controller, configured to generate the control signal to control the delay of the second clock signal relative to the second data signal; a sampler, coupled to the delay element, configured to generate a sampled data signal according to the second data signal and the second clock signal; and a bit error rate determination circuit, coupled to the sampler, configured to determine whether the sampled data signal is the same as a predefined test pattern and generate a determination result accordingly; wherein the controller determines a timing margin according to the determination result.

16 Claims, 6 Drawing Sheets

(56) References Cited

U.S. PATENT DOCUMENTS

| | | | | |
|---|---|---|---|---|
| 2005/0110548 A1* | 5/2005 | Suda | ............... | G01R 31/31922 |
| | | | | 327/277 |
| 2014/0258795 A1* | 9/2014 | Schnizler | ............. | H04L 25/064 |
| | | | | 714/705 |
| 2016/0006589 A1* | 1/2016 | Kamali | ............. | H04L 25/03343 |
| | | | | 375/232 |
| 2016/0056980 A1* | 2/2016 | Wang | ............... | H04L 25/03057 |
| | | | | 375/233 |
| 2016/0072650 A1* | 3/2016 | Mobin | ............... | H04L 25/0278 |
| | | | | 375/219 |
| 2017/0359153 A1* | 12/2017 | Usui | ...................... | H04L 1/203 |
| 2018/0083604 A1* | 3/2018 | Lu | ......................... | H04L 1/20 |
| 2019/0181970 A1* | 6/2019 | Simpson | ............. | H04L 1/0041 |

* cited by examiner

TIMING MARGIN DETECTING CIRCUIT, TIMING MARGIN DETECTING METHOD AND CLOCK AND DATA RECOVERY SYSTEM

BACKGROUND OF THE INVENTION

1. Field of the Invention

The present application relates to a timing margin detecting circuit, a timing margin detecting method and a clock and data recovery system, and more particularly, to a timing margin detecting circuit, a timing margin detecting method and a clock and data recovery system with low circuit complexity and low power consumption.

2. Description of the Prior Art

Timing margin detection is important for the clock and data recovery (CDR) circuit. The timing margin detection is able to obtain information of phase/timing difference between the data signal and the clock signal, so as to obtain information regarding mismatch between different circuits, interference, asymmetry, etc. Timing margin information can be used by phase compensation circuit as reference.

In the prior art, the timing margin (e.g., an eye width) may be obtained via oversampling or by phase interpolator. Obtaining the timing margin via oversampling would further raise the clock rate, which would consume more power. On the other hand, obtaining the timing margin by the phase interpolator would raise the circuit complexity and the circuit area.

Therefore, it is necessary to improve the prior art.

SUMMARY OF THE INVENTION

It is therefore a primary objective of the present application to provide a timing margin detecting circuit, a timing margin detecting method and a clock and data recovery system, to improve over disadvantages of the prior art.

An embodiment of the present application discloses a timing margin detecting circuit coupled to a clock and data recovery (CDR) circuit. The timing margin detecting circuit comprises a delay element, receiving a first data signal and a first clock signal, configured to generate a second data signal and a second clock signal according a control signal, the first data signal and the first clock, wherein the second clock signal has a delay relative to the second data signal; a controller, configured to generate the control signal to control the delay of the second clock signal relative to the second data signal; a sampler, coupled to the delay element, configured to generate a sampled data signal according to the second data signal and the second clock signal; and a bit error rate determination circuit, coupled to the sampler, configured to determine whether the sampled data signal is the same as a predefined test pattern and generate a determination result accordingly, wherein the determination result indicates whether the sampled data signal is the same as the predefined test pattern; wherein the controller determines a timing margin according to the determination result.

An embodiment of the present application further discloses a timing margin detecting method, applied in a timing margin detecting circuit coupled to a clock and data recovery (CDR) circuit. The method comprises receiving a first data signal and a first clock signal and generating a second data signal and a second clock signal according a control signal, the first data signal and the first clock signal, wherein the second clock signal has a delay relative to the second data signal; generating a sampled data signal according to the second data signal and the second clock signal; determining whether the sampled data signal is the same as a predefined test pattern and generate a determination result accordingly, wherein the determination result indicates whether the sampled data signal is the same as the predefined test pattern; and determining a timing margin according to the determination result.

An embodiment of the present application further discloses a clock and data recovery (CDR) system. The CDR system comprises a CDR circuit; and a timing margin detecting circuit coupled to the CDR circuit. The timing margin detecting circuit comprises a delay element, receiving a first data signal and a first clock signal from the CDR circuit, configured to generate a second data signal and a second clock signal according a control signal, the first data signal and the first clock, wherein the second clock signal has a delay relative to the second data signal; a controller, configured to generate the control signal to control the delay of the second clock signal relative to the second data signal; a first sampler, coupled to the delay element, configured to generate a sampled data signal according to the second data signal and the second clock signal; and a bit error rate determination circuit, coupled to the sampler, configured to determine whether the sampled data signal is the same as a predefined test pattern and generate a determination result accordingly, wherein the determination result indicates whether that the sampled data signal is the same as the predefined test pattern; wherein the controller determines a timing margin according to the determination result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
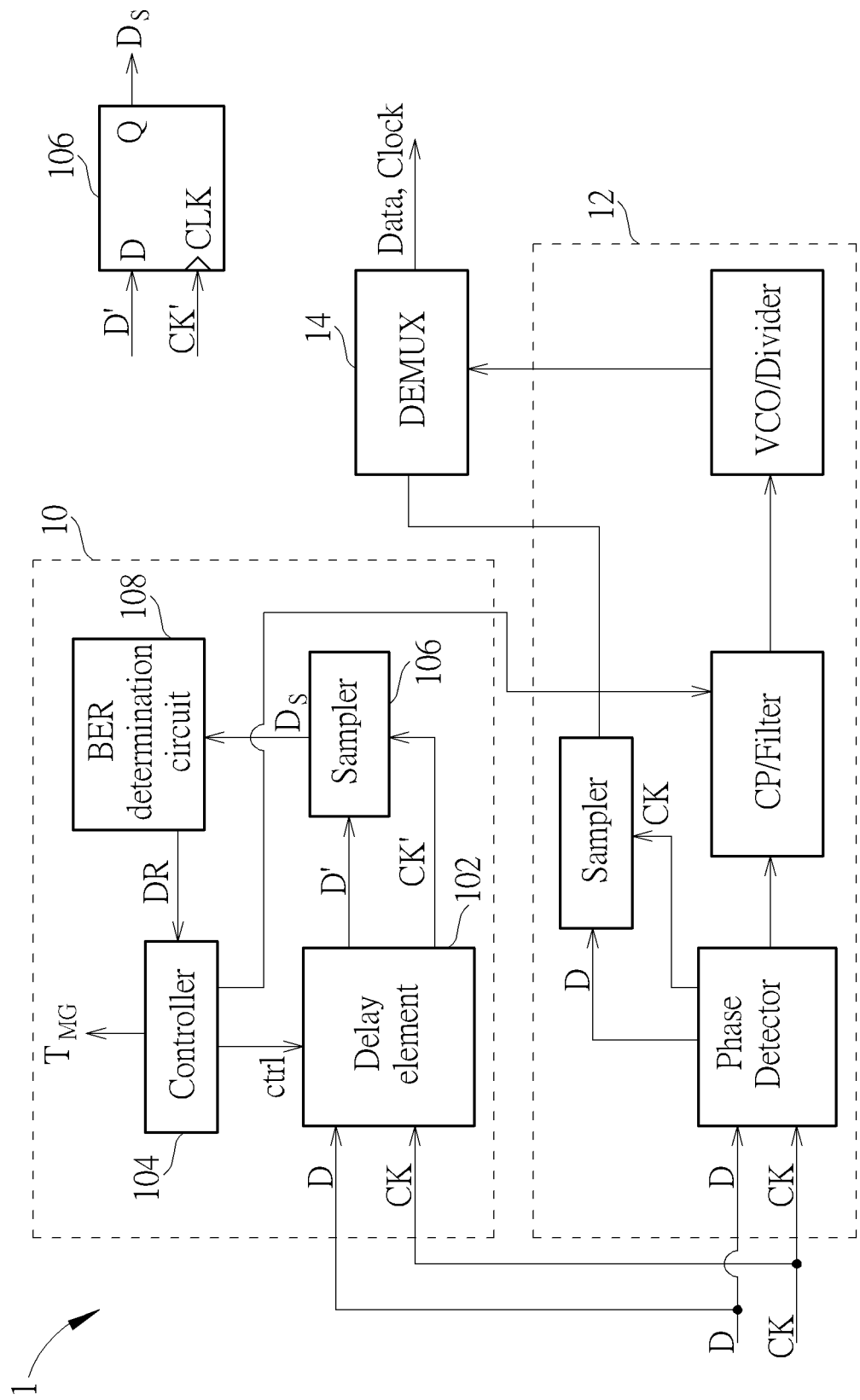
FIG. 1 is a schematic diagram of a clock and data recovery (CDR) system according to an embodiment of the present application.

FIG. 1 is a schematic diagram of a clock and data recovery (CDR) system 1 according to an embodiment of the present application. The CDR system 1 may be applied/disposed within a digital system, which receives a data signal and a clock signal. The CDR system 1 comprises a timing margin detecting circuit 10 and a CDR circuit 12. The CDR circuit 12 may comprise a phase detector, a charge pump (CP)/filter, a voltage control oscillator (VCO)/divider, and a sampler, where the sampler may be a delay flip-flop (D flip-flop, a.k.a., DFF). Note that, the CDR circuit 12 serves an example of (general) CDR circuit, which does not intend to preclude other CDR circuit topology. Various CDR circuits may be incorporated into the CDR system 1 of the present application, which is within the scope the present application.

The timing margin detecting circuit 10 is configured to obtain a timing margin of a first data signal D and a first clock signal CK of the CDR system 1. The timing margin, as known in the art, is usually referred to the time that the data eye (or, eye width) is valid for a device to be sampled as a logic "1" or a logic "0". Physically, in the present application, the timing margin may be referred to a setup time or a hold time for the CDR system.

Figure 2:
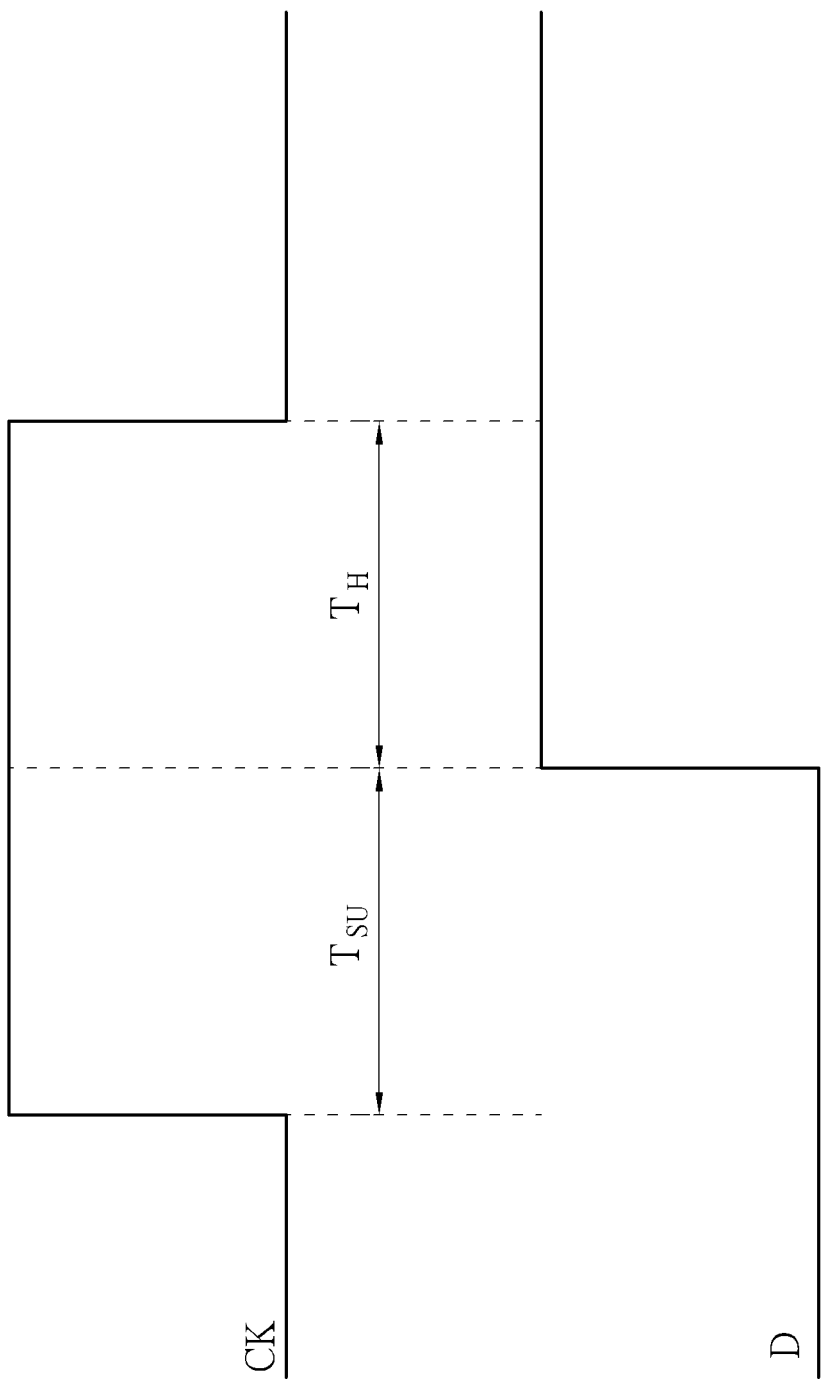
FIG. 2 is a schematic diagram of waveforms of a clock signal and a data signal according to an embodiment of the present application.

For example, FIG. 2 illustrates a schematic diagram of waveforms of the data signal D and the clock signal CK, demonstrating an illustration of a setup time $T_{SU}$ and a hold time $T_H$. As known in the art, the setup time $T_{SU}$ is referred to a time interval (or an amount of time) for which the data signal D remains stable before an (active) edge of the clock signal CK; while the hold time $T_H$ is referred to a time interval for which the data signal D remains stable after the (active) edge of the clock signal CK. The timing margin detecting circuit 10 may be configured to obtain either the setup time $T_{SU}$ or the hold time $T_H$ (or both), as a timing margin $T_{MG}$, corresponding to the data signal D and the clock signal CK of the CDR system 1.

The timing margin detecting circuit 10 comprises a delay element 102, a controller 104, a sampler 106 and a bit error rate (BER) determination circuit 108. The controller 104 is configured to generate a control signal ctrl to/for the delay element 104. The delay element 102 receives the (first) data signal D and the (first) clock signal CK. The delay element 102 is configured to generate a second data signal D' and a second clock signal CK', which are generated according to the data signal D, the clock signal CK and the control signal ctrl. The (second) data signal D' may be the original (first) data signal D or a delayed version of the (first) data signal D; while the (second) clock signal CK' may be the original (first) clock signal CK or a delayed version of the (first) clock signal CK. Between the data signal D' and the clock signal CK', a delay (or phase/time shift) d exists. That is, the clock signal CK' has the delay d relative to the data signal D'. The length of the delay d is controlled by the controller 104 via the control signal ctrl.

In an embodiment, the delay d may be a time difference between an edge (e.g., a rising edge) of the clock signal CK' and an edge (e.g., a rising edge) of the data signal D', and not limited thereto.

In an embodiment, the sampler 106 may be a D flip-flop (DFF), which is illustrated in the upper right portion of FIG. 1. The sampler 106 is coupled to the delay element 102 to receive the data signal D' and the clock signal CK'. The sampler 106 would generate a sampled data signal $D_S$ according to the data signal D' and the clock signal CK'.

The BER determination circuit 108 is coupled to the sampler 106 and may be realized at least by one or more exclusive or gates (XOR). The BER determination circuit 108 is configured to compare the sampled data signal $D_S$ and a predefined test pattern $D_P$ so as to determine whether the sampled data signal $D_S$ is the same as a predefined test pattern $D_P$, and generate a determination result DR. For illustrative purpose, the determination result DR may, indicates whether or not the sampled data signal $D_S$ is the same as a predefined test pattern $D_P$, represented by a logic '1' or '0'. The determination result DR as a logic '0' may indicate that the sampled data signal $D_S$ is the same as the predefined test pattern $D_P$; while the determination result DR as a logic '1' may indicate that the sampled data signal $D_S$ is not the same as the predefined test pattern $D_P$.

In an embodiment, a data signal D including a series of data bits same as the predefined test pattern Dp may be inputted to the delay element 102. The delay element 102 may generate the second data signals D' with respect to the different delays $d_0$-$d_N$ and a plurality of (second) clock signal $CK_0'$-$CK_N'$ corresponding to the delays $d_0$-$d_N$ relative to the data signal D'. The sampler 106 may generate a plurality of sampled data signals $D_{S,0}$-$D_{S,N}$ based on the data signal D' corresponding to the plurality of delays $d_0$-$d_N$. The BER determination circuit 108 may generate a plurality of determination results DR_0-DR_N corresponding to the plurality of delays $d_0$-$d_N$ according to the plurality of sampled data signals $D_{S,0}$-$D_{S,N}$, where a determination result DR_n indicates whether a sampled data signal $D_{S,n}$ is equal to the predefined test pattern $D_P$, and the BER determination circuit 108 may feed to the determination results DR_0-DR_N to the controller 104. The controller 104 may generate a plurality of control signals ctrl_0-ctrl_N respectively corresponding to a plurality of delays $d_0$-$d_N$, to the delay element 102. The controller 104 would determine the timing margin $T_{MG}$ according to the plurality of determination results DR_0-DR_N corresponding to the plurality of delays $d_0$-$d_N$.

Figure 3:
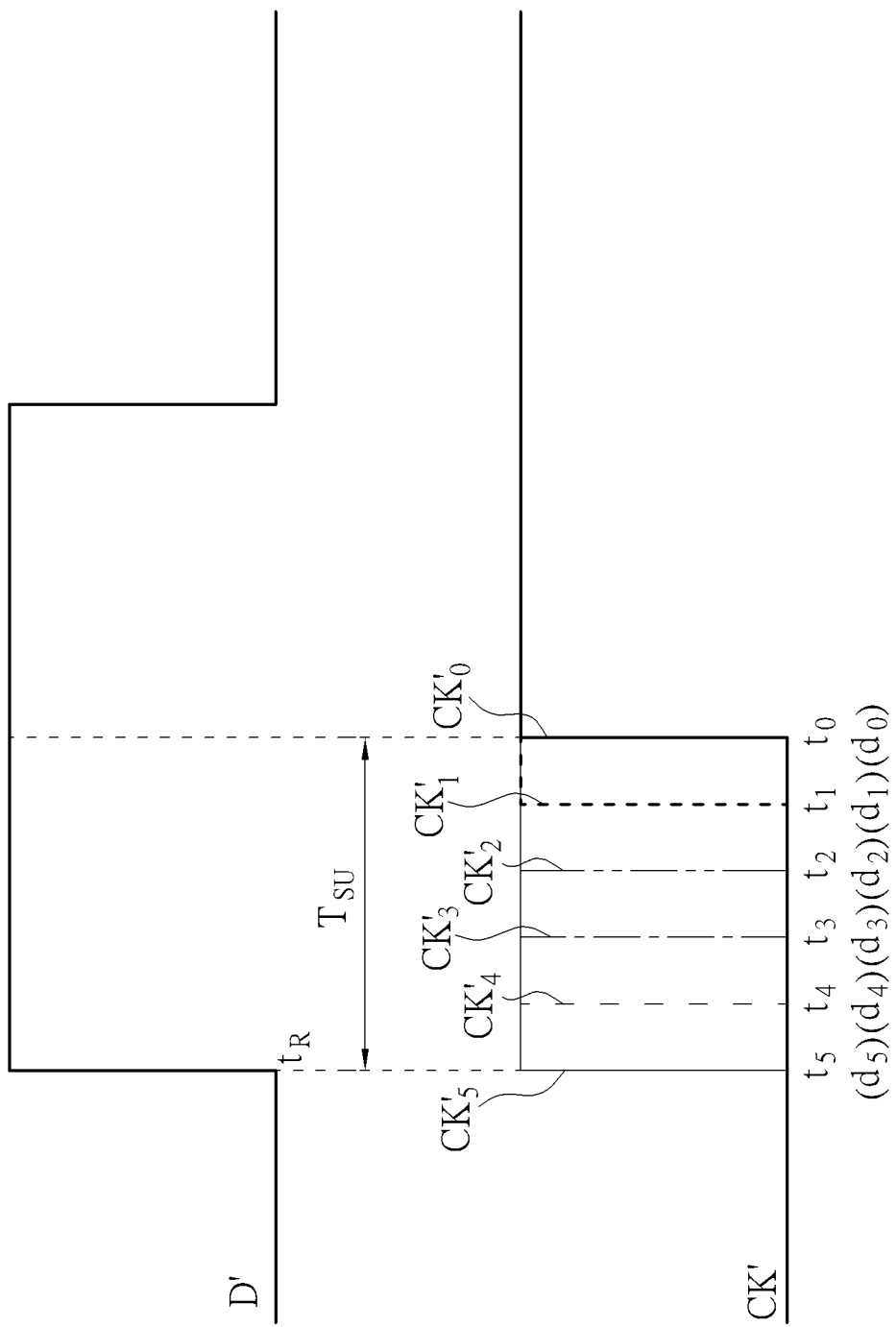
FIG. 3 is a schematic diagram of waveforms of a clock signal and a data signal according to an embodiment of the present application.

Take N=5 as an example, FIG. 3 illustrates a schematic diagram of waveforms of the (second) data signal D' and a plurality of (second) clock signals $CK_0'$-$CK_5'$. In FIG. 3, the data signal D' has a rising edge at a time $t_R$. The clock signals $CK_0'$-$CK_5'$ are corresponding to delays $d_0$-$d_5$ and have rising edges at times $t_0$-$t_5$. The sampler 106 may produce sampled data signals $D_{S,0}$-$D_{S,5}$ corresponding to the delays $d_0$-$d_5$. A delay $d_n$ may be expressed as $d_n=t_n-t_R$, while the index n herein ranges from 0 to 5. The sampled data signals $D_{S,0}$-$D_{S,5}$ are inputted to the BER determination circuit 108 for generating a plurality of determination results DR_0-DR_5 corresponding to the plurality of delays $d_0$-$d_5$.

In the embodiment shown in FIG. 3, the data signal D/D' is supposed to be the same as the predefined test pattern $D_P$, and in this circumstance, the determination results DR_0-DR_4 indicates that the sampled data signals $D_{S,0}$-$D_{S,4}$ may be equal to the predefined test pattern $D_P$, r, and the determination result DR_5 indicates that the sampled data signal $D_{S,5}$ may not be equal to the predefined test pattern $D_P$. Hence, the controller 104 may obtain/approximate the setup time $T_{SU}$ according to the delays $d_0$ and $d_5$, or according to the delays $d_0$ and $d_4$.

Specifically, supposed that a first phase difference between the (first) data signal D and the (first) clock signal CK is equal to a second phase difference between the (second) data signal D' and the (second) clock signal CK', which is the delay $d_0$. The delay $d_0$ may be regarded as an initial delay, and the control signal ctrl_0 corresponding to the initial delay $d_0$ may be regarded as initial control signal. In this case, the controller 104 may obtain/approximate the setup time $T_{SU}$ as $T_{SU}=d_0-d_5$ or $T_{SU}=d_0-d_4$. In other words, for all the delays $d_1$-$d_5$ being less than the initial delay $d_0$ (i.e., $d_n<d_0$ ∀ for n=1, . . . ,5), the controller 104 may obtain/approximate the setup time $T_{SU}$ according to the initial delay $d_0$ and the delay $d_5$, the largest delay resulting in a wrong sampled data signal, or according to the initial delay $d_0$ and the delay $d_4$, the smallest delay resulting in an correct sampled data signal.

Figure 4:
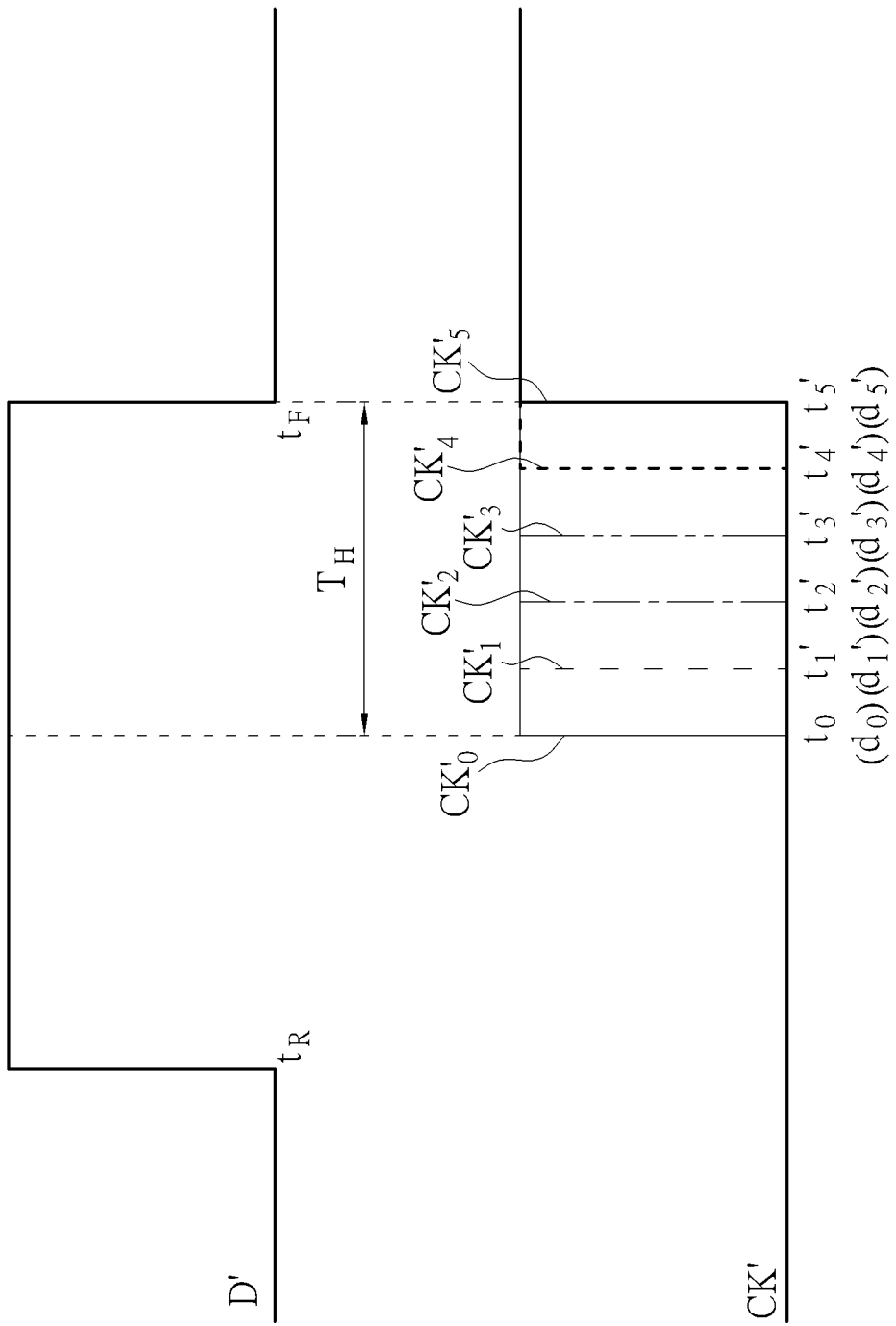
FIG. 4 is a schematic diagram of waveforms of a clock signal and a data signal according to an embodiment of the present application.

In addition, the controller 104 may use the same/similar rationale to obtain/approximate the hold time $T_H$. FIG. 4 also illustrates a schematic diagram of waveforms of the (second)

data signal D' and a plurality of (second) clock signals $CK_0'$-$CK_5'$. In FIG. 4, the data signal D' has a falling edge at a time $t_F$. The clock signals $CK_0'$-$CK_5'$ illustrated in FIG. 4 are corresponding to delays $d_0$ and $d_1'$-$d_5'$ and have rising edges at times $t_0$ and $t_1'$-$t_5'$, where $d_n'=t_n'-t_R$ and $t_5'>t_F$. The sampled data signals $D_{S,0}$ and $D_{S,1}'$-$D_{S,4}'$ sampled at the times $t_0$ and $t_1'$-$t_4'$, respectively. Under the same circumstance as above, the determination results DR_0 and DR_1'-DR_4' respectively indicate that the sampled data signals $D_{S,0}$ and $D_{S,1}'$-$D_{S,4}'$ may be equal to the predefined test pattern $D_P$, and the determination results DR_5' indicates that the sampled data signal $D_{S,5}'$ may not be equal to the predefined test pattern D. The controller 104 may obtain/approximate the hold time $T_H$ according to the delays $d_0$ and $d_5'$, or according to the delays $d_0$ and $d_4'$. That is, for all the delays $d_1'$-$d_5'$ being greater than the initial delay $d_0$ (i.e., $d_n'>d_0$ for n=1, . . . ,5), the controller 104 may obtain/approximate the hold time $T_H$ according to the initial delay $d_0$ and the delay $d_5'$, the smallest delay resulting in a wrong sampled data signal, or according to the initial delay $d_0$ and the delay $d_4'$, the largest delay resulting in a correct sampled data signal.

From the embodiments in FIG. 3 and FIG. 4, the controller 104 may obtain an eye width $T_{EW}$ as $T_{EW}=T_{SU}+T_H$, according to the delay $d_5$ corresponding to the determination result DR_5 and the delay $d_5'$ corresponding to the determination result DR_5', for example. Note that, $d_5<d_4, \ldots , d_1, d_0, d_1', \ldots ,d_4'<d_5'$.

Compared to the prior art, the timing margin detecting circuit 10 has low circuit complexity and consumes less power.

Figure 5:
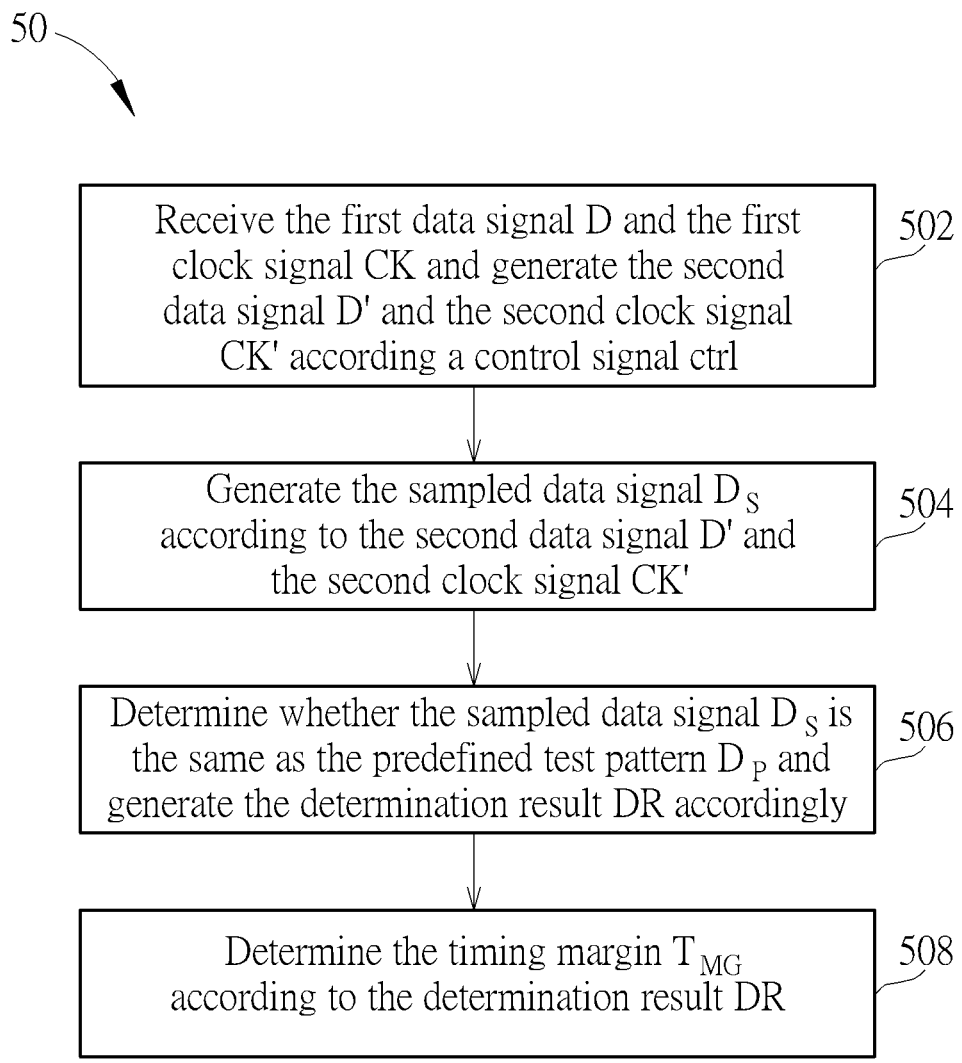
FIG. 5 is a schematic diagram of a process according to an embodiment of the present application.

Operations of the timing margin detecting circuit 10 can be summarized as a process 50 (timing margin scanning process). As FIG. 5 shows, the process 50 comprises the following steps.

Step 502: Receive the first data signal D and the first clock signal CK and generate the second data signal D' and the second clock signal CK' according a control signal ctrl.

Step 504: Generate the sampled data signal $D_S$ according to the second data signal D' and the second clock signal CK'.

Step 506: Determine whether the sampled data signal $D_S$ is the same as the predefined test pattern $D_P$ and generate the determination result DR accordingly.

Step 508: Determine the timing margin $T_{MG}$ according to the determination result DR.

Figure 6:
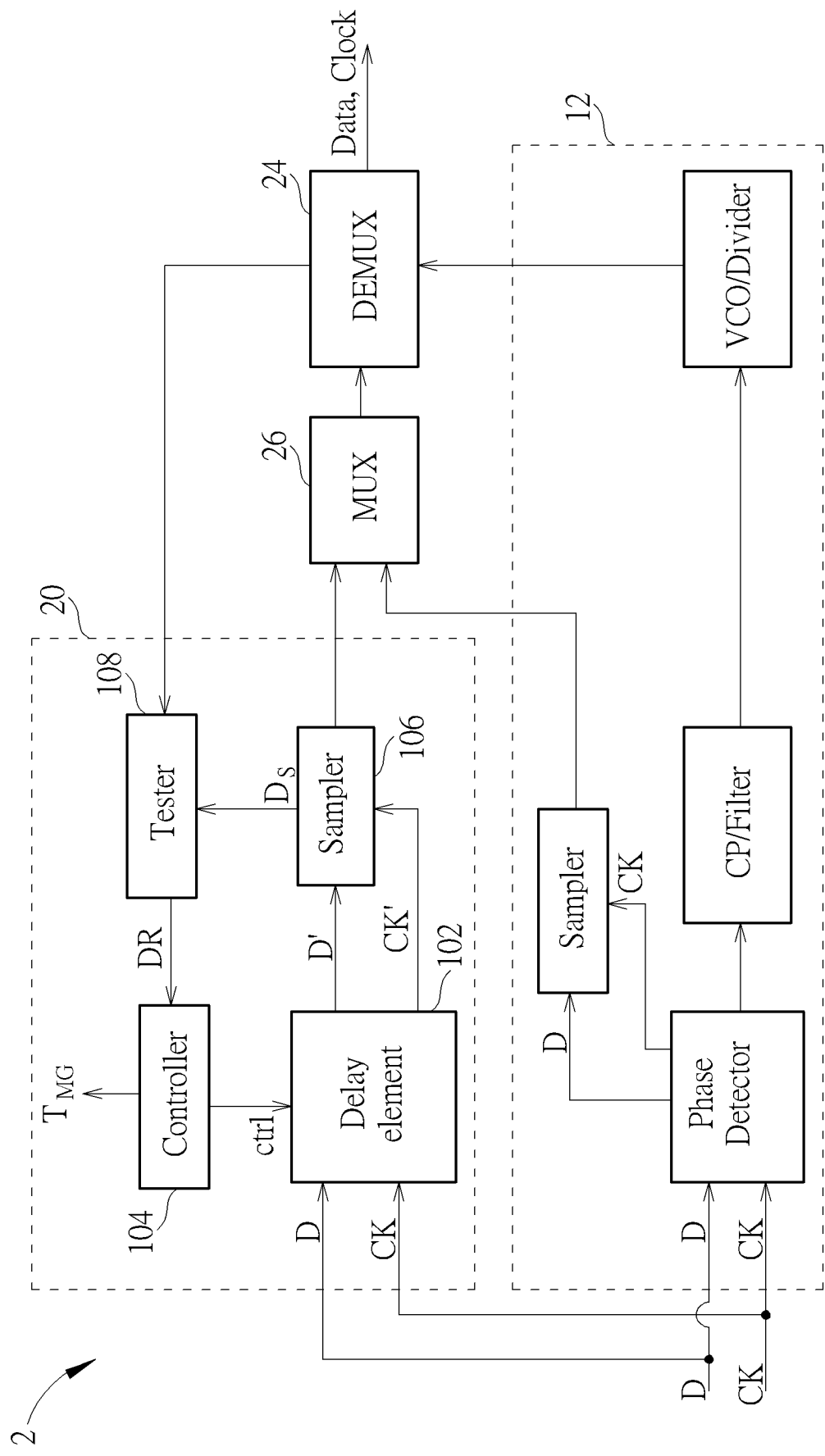
FIG. 6 is a schematic diagram of a CDR system according to an embodiment of the present application.

Notably, the embodiments stated in the above are utilized for illustrating the concept of the present application. Those skilled in the art may make modifications and alterations accordingly, and not limited herein. For example, FIG. 6 is a schematic diagram of a CDR system 2 according to an embodiment of the present application. The CDR system 2 is similar to the CDR system 1, and thus, the same components are denoted by the same symbols. Different from the CDR system 1, the CDR system 2 comprises a timing margin detecting circuit 20 and further comprises a multiplexer 26. The multiplexer 26 would select one of signals, either from the sampler 106 within the timing margin detecting circuit 20, or from the sampler within the CDR circuit 12, and outputs it to a demultiplexer 24. The demultiplexer 24 would receive a clock signal with a reduced clock rate from the frequency divider within the CDR circuit 12. An output of the demultiplexer 24 is fed to the BER determination circuit 108, such that the BER determination circuit 108 may perform the determining operation, either on the result(s) from the data signal D' and the clock CK' corresponding to the timing margin detecting circuit 20, or on the result(s) from the data signal D and the clock CK corresponding to the CDR circuit 12, which is also within the scope of the present application.

Based on the delay $d_5$ and the delay $d_5'$, the controller 104 may also obtain information regarding to the timing margin is symmetrical or not, and may select a different bandwidth of the CDR circuit by adjusting the configuration of the equalizer or adjusting the configuration of the charge pump/filter of the CDR circuit 12. By repeatedly processing the timing margin scanning process under different configurations of the equalizer (or the charge pump/filter of the CDR circuit), the controller 104 may obtain different results of timing margin and whether it is symmetrical or not. As a result, the controller 104 may select the most proper configuration of the equalizer (or the charge pump/filter of the CDR circuit) that leads to the greatest timing margin.

In summary, the present application utilizes the controller to control the delay between the second data signal and the second clock signal. Furthermore, the controller scans over the eye width of the data signal, so as to obtain the timing margin. Compared to the prior art, the present application owns advantages of low circuit complexity and low power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A timing margin detecting circuit, coupled to a clock and data recovery (CDR) circuit, the timing margin detecting circuit comprising:

a delay element, receiving a first data signal and a first clock signal, configured to generate a second data signal and a second clock signal according to a control signal, the first data signal and the first clock, wherein the second clock signal has a delay relative to the second data signal;

a controller, configured to generate the control signal to control the delay of the second clock signal relative to the second data signal and determine a timing margin corresponding to a configuration of the CDR circuit that makes the CDR circuit operate in a corresponding bandwidth;

a sampler, coupled to the delay element, configured to generate a sampled data signal according to the second data signal and the second clock signal; and a bit error rate determination circuit, coupled to the sampler, configured to determine whether the sampled data signal is the same as a predefined test pattern and generate a determination result accordingly, wherein the determination result is a first logic value, indicating that the sampled data signal is the same as the predefined test pattern or a second logic value opposite to the first logic value, indicating that the sampled data signal is not the same as the predefined test pattern;

wherein the controller determines the timing margin according to a plurality of determination results that the bit error rate determination circuit generates corresponding to a plurality of delays, and the controller adjusts the configuration of the CDR circuit to determine an another timing margin;

wherein the controller obtains a first determination result corresponding to a first delay and the first determination result indicates that the sampled data signal is not the same as the predefined test pattern; the controller obtains a second determination result corresponding to a second delay and the second determination result indicates that the sampled data signal is not the same as the predefined test pattern; the controller obtains a third determination result corresponding to a third delay and the third determination result indicates that the sampled data signal is the same as the predefined test pattern, the third delay is larger than the first delay and smaller than the second delay; and the controller determines the timing margin according to the first delay corresponding to the first determination result and the second delay corresponding to the second determination result.

2. The timing margin detecting circuit of claim 1, wherein the second data signal is the original first data signal or a delayed version of the first data signal;
the second clock signal is the original first clock signal or a delayed version of the first clock signal.

3. The timing margin detecting circuit of claim 1, wherein the sampler comprises a delay flip-flop (D flip-flop).

4. The timing margin detecting circuit of claim 1, wherein the bit error rate determination circuit comprises an exclusive or (XOR) gate.

5. The timing margin detecting circuit of claim 1, wherein the controller generates a plurality of control signals to the delay element, and the plurality of control signals is corresponding to the plurality of delays of the second clock signal relative to the second data signal;
the sampler generates a plurality of sampled data signals corresponding to the plurality of delays;
the bit error rate determination circuit generates the plurality of determination results corresponding to the plurality of delays according to the plurality of sampled data signals.

6. The timing margin detecting circuit of claim 1, wherein the controller determines an eye width according to the first delay corresponding to the first determination result and the second delay corresponding to the second determination result.

7. The timing margin detecting circuit of claim 1, wherein the controller generates an initial control signal corresponding to an initial delay of the second clock signal relative to the second data signal, and the initial delay is the same as a delay of the first clock signal relative to the first data signal;
the controller generates a plurality of control signals to the delay element, and the plurality of control signals is corresponding to a plurality of delays of the second clock signal relative to the second data signal.

8. The timing margin detecting circuit of claim 7, wherein the controller determines a setup time according to the initial delay and the first delay corresponding to the first determination result.

9. The timing margin detecting circuit of claim 7, wherein the controller determines a hold time according to the initial delay and the first delay corresponding to the first determination result.

10. A timing margin detecting method, applied in a timing margin detecting circuit coupled to a clock and data recovery (CDR) circuit, the method comprising:
receiving a first data signal and a first clock signal and generating a second data signal and a second clock signal according to a control signal, the first data signal and the first clock signal, wherein the second clock signal has a delay relative to the second data signal;
generating a sampled data signal according to the second data signal and the second clock signal;
determining whether the sampled data signal is the same as a predefined test pattern and generate a determination result accordingly, wherein the determination result is a first logic value, indicating that the sampled data signal is the same as the predefined test pattern or a second logic value opposite to the first logic value, indicating that the sampled data signal is not the same as the predefined test pattern;
determining a timing margin corresponding to a configuration of the CDR circuit that makes the CDR circuit operate in a corresponding bandwidth;
determining the timing margin according to a plurality of determination results corresponding to a plurality of delays;
adjusting the configuration of the CDR circuit to determine an another timing margin; and
determining the timing margin according to a first delay and a second delay when a first determination result corresponding to the first delay, a second determination result corresponding to the second delay and a third determination result corresponding to a third delay are obtained, wherein the first determination result and the second determination result indicate that the sampled data signal is not the same as the predefined test pattern, and the third determination result indicates that the sampled data signal is the same as the predefined test pattern;
wherein the third delay is larger than the first delay and smaller than the second delay.

11. The timing margin detecting method of claim 10, further comprising:
generating a plurality of control signals corresponding to the plurality of delays of the second clock signal relative to the second data signal;
generating a plurality of sampled data signals corresponding to the plurality of delays; and
generating the plurality of determination results corresponding to the plurality of delays according to the plurality of sampled data signals.

12. The timing margin detecting method of claim 10, further comprising:
determining an eye width according to a first delay and a second delay.

13. The timing margin detecting method of claim 10, further comprising:
determining a setup time according to an initial delay and the first delay;
wherein the initial delay is the same as a delay of the first clock signal relative to the first data signal, and the initial delay is larger than the first delay.

14. The timing margin detecting method of claim 10, further comprising:
determining a hold time according to an initial delay and the first delay;
wherein the initial delay is the same as a delay of the first clock signal relative to the first data signal, and the initial delay is smaller than the first delay.

15. A clock and data recovery (CDR) system, comprising:
a CDR circuit; and
a timing margin detecting circuit, coupled to the CDR circuit, comprising:
a delay element, receiving a first data signal and a first clock signal, configured to generate a second data signal and a second clock signal according to a control signal, the first data signal and the first clock, wherein the second clock signal has a delay relative to the second data signal;
a controller, configured to generate the control signal to control the delay of the second clock signal relative to the second data signal and determine a timing margin corresponding to a configuration of the CDR circuit that makes the CDR circuit operate in a corresponding bandwidth;

a first sampler, coupled to the delay element, configured to generate a sampled data signal according to the second data signal and the second clock signal; and a bit error rate determination circuit, coupled to the sampler, configured to determine whether the sampled data signal is the same as a predefined test pattern and generate a determination result accordingly, wherein the determination result is a first logic value, indicating that the sampled data signal is the same as the predefined test pattern or a second logic value opposite to the first logic value, indicating that the sampled data signal is not the same as the predefined test pattern;

wherein the controller determines the timing margin according to a plurality of determination results that the bit error rate determination circuit generates corresponding to a plurality of delays, and the controller adjusts the configuration of the CDR circuit to determine an another timing margin;

wherein the controller obtains a first determination result corresponding to a first delay and the first determination result indicates that the sampled data signal is not the same as the predefined test pattern; the controller obtains a second determination result corresponding to a second delay and the second determination result indicates that the sampled data signal is not the same as the predefined test pattern; the controller obtains a third determination result corresponding to a third delay and the third determination result indicates that the sampled data signal is the same as the predefined test pattern, the third delay is larger than the first delay and smaller than the second delay; and the controller determines the timing margin according to the first delay corresponding to the first determination result and the second delay corresponding to the second determination result.

16. The CDR system of claim 15, wherein the CDR circuit comprises
   a phase detector;
   a voltage control oscillator;
   a filter, coupled between the phase detector and the voltage control oscillator; and
   a second sampler, coupled to the phase detector.

* * * * *